United States Patent
Bui et al.

(10) Patent No.: US 6,703,305 B1
(45) Date of Patent: Mar. 9, 2004

(54) SEMICONDUCTOR DEVICE HAVING METALLIZED INTERCONNECT STRUCTURE AND METHOD OF FABRICATION

(75) Inventors: Nguyen Duc Bui, San Jose, CA (US); Farrokh Kia Omid-zohoor, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/164,484

(22) Filed: Jun. 5, 2002

(51) Int. Cl.[7] .................... H01L 21/4763; H01L 21/44; H01L 21/461
(52) U.S. Cl. .................. 438/640; 438/667; 438/672; 438/756
(58) Field of Search .......................... 436/756

(56) References Cited

U.S. PATENT DOCUMENTS

| | | | |
|---|---|---|---|
| 4,489,481 A | 12/1984 | Jones | 438/623 |
| 5,269,880 A | 12/1993 | Jolly et al. | 438/781 |
| 6,136,696 A | * 10/2000 | Horiba | 438/639 |
| 6,146,996 A | * 11/2000 | Sengupta | 438/639 |
| 6,171,964 B1 | 1/2001 | Gonzalez et al. | 438/697 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 399–400.*

* cited by examiner

*Primary Examiner*—Olik Chaudhuri
*Assistant Examiner*—William M. Brewster
(74) *Attorney, Agent, or Firm*—Brinks, Hofer, Gilson & Lione

(57) ABSTRACT

A semiconductor device having a metallized interconnect structure includes a conductor having an upper contact surface and an edge surface depending from the upper contact surface. An opening in an insulating layer overlying the conduct exposes at least a portion of the upper contact surface and at least a portion of edge surface. A liner material covers the edge surface and a portion of the upper contact surface exposed by the opening. An electrically conductive material resides within the opening and is separated from the edge surface by the liner material. A method for fabricating the metallized contact structure includes the deposition and anisotrophic etching of a liner material that is differentially etchable with respect to the insulating layer overlying the conductor. By covering the edge surface of the conductor, a metallized contact structure is provided that can be reliably fabricated using zero-overlap design tolerances.

11 Claims, 4 Drawing Sheets

SEMICONDUCTOR DEVICE HAVING METALLIZED INTERCONNECT STRUCTURE AND METHOD OF FABRICATION

TECHNICAL FIELD

The present invention relates, generally, to semiconductor devices and. more particularly, to semiconductor devices having metallized interconnect structures and to methods for their fabrication.

BACKGROUND

Advanced integrated circuits typically employ numerous metal interconnect layers overlying integrated circuit components formed on a semiconductor substrate. The metal interconnect layers are vertically arranged over the device components and are separated from one another by inter-level-dielectric (ILD) layers. The metal interconnect layers are electrically connected through structures, known as vias and contacts, formed in the ILD layers. A via, for example, is an opening formed in an ILD layer positioned between two vertically separated metal interconnect layers. Correspondingly, a contact is an opening in an insulating layer that overlies the device component. An electrical connection is made to the substrate or to a device component through the contact opening. Advanced integrated circuits employ numerous contacts and vias to electrically connect millions of transistors and other components used in an integrated circuit device.

As the feature sizes of integrated circuit components is reduced to smaller and smaller dimensions, the alignment tolerances for fabrication of the integrated circuit must also be reduced. Typically, as the feature size of an integrated circuit is reduced all critical dimensions are correspondingly scaled to reflect the smaller feature size. This means that, for example, the lateral width of conductors, such as metal interconnects, gate electrodes, and the like, is reduced by a scaling factor. In addition to line widths, the size of via openings and contact openings are also scaled to smaller dimensions.

If the contact and via openings could be reduced in size by the same factor as the line width of other device components, the alignment tolerance to which the integrated circuit is fabricated would not change. The fabrication of a low resistance metal interconnect structure, however, requires that a certain amount of contact area exist at the interface between a metallized interconnect, such as via plug, to maintain a sufficiently small contact resistance. Also, the overall integrated circuit design parameters, require that the device function at specified signal frequencies. The maintenance of the signal frequency, in turn, requires that the contact resistance not be excessively large.

To satisfy the low contact resistance requirements as the feature sizes are reduced and the design tolerances are decreased, the contact and via dimension are not reduced to the same extent as the characteristic line width of the underlying device components. This results in a design criteria known as "zero overlap." Under a zero overlap design tolerance, the contact or via opening is aligned very close to the edge of the underlying device component.

A typical arrangement is shown in the cross-sectional view of FIG. 1A, where a semiconductor substrate 10 supports a device layer 12. A conductor 14 overlies a portion of the device layer and an ILD layer 16 overlies conductor 14. A via opening 18 in ILD layer 16 exposes a contact portion 20 of conductor 14. Under stringent alignment tolerances, via opening 18 is positioned in close proximity to a wall surface 22 of conductor 14. As illustrated in the top view shown of FIG. 1B, opening 18 is positioned in close proximity to wall surface 22 and to a lateral wall surface 24.

Opening 18 is positioned a distance D1 from wall surface 22 and a distance D2 from wall surface 24. Under the design rules illustrated in FIG. 1B, opening 18 will always be positioned at a specified distance. D1 and D2, from the wall surfaces of conductor 14. The design rules specifying D1 and D2 are developed for a specific line width W. As the line width W is reduced, in order for via opening 18 to remain at a constant size, D1 and D2 must also be reduced. As the dimensions D1 and D2 are reduced, however, the possibility for misalignment increases. FIG. 1C illustrates a misaligned condition in which via opening 18 has been misaligned to conductor 14. A portion of via opening 18 exposes a wall surface 22 of conductor 14.

The misalignment of via opening 18 to conductor 14 adversely affects devire performance by undesirably increasing contact resistance. The increased contact resistance arises through both a reduced contact area and through damage to conductor 14 during fabrication of the via opening. Accordingly, a need existed for a metallized interconnect structure and method of fabrication that allows for contact misalignment, while maintaining good contact integrity and low contact resistance.

SUMMARY

The present invention provides a metallized interconnect structure and method of fabrication that fully compensates for misalignment of via and contact openings in integrated circuits and other semiconductor devices fabricated to zero-overlap design tolerances. In accordance with one aspect of the invention, a semiconductor device includes a conductor having an upper contact surface and an edge surface depending from the upper contact surface. An insulating layer overlies the conductor and an opening in the insulating layer exposes at least a portion of the upper contact surface. The opening also exposes at least a portion of the edge surface. A liner material covers at least the edge surface of the conductor that is exposed by the opening.

In another aspect of the invention, a process is provided for fabricating a metallized interconnect structure that includes providing a first conductor and an insulating layer overlying the first conductor. The first conductor has an upper contact surface and an edge surface depending from the upper contact surface. An opening is formed in the insulating layer that exposes at least a portion of the upper contact surface and at least a portion of the edge surface. A liner is formed to overlie at least the portion of the edge surface that is exposed by the opening. The opening is then filled with an electrically conductive material.

Figure 1A:
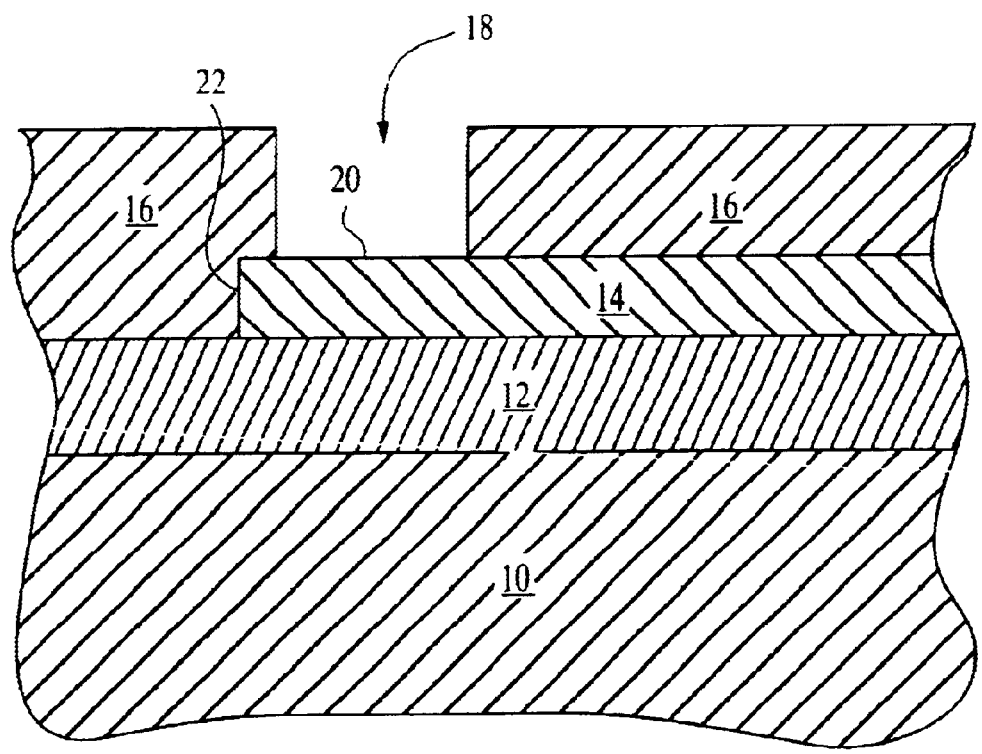
FIG. 1A illustrates, in cross-section, a portion of a semiconductor device that includes a via opening aligned to a conductive layer.
Figure 1B:
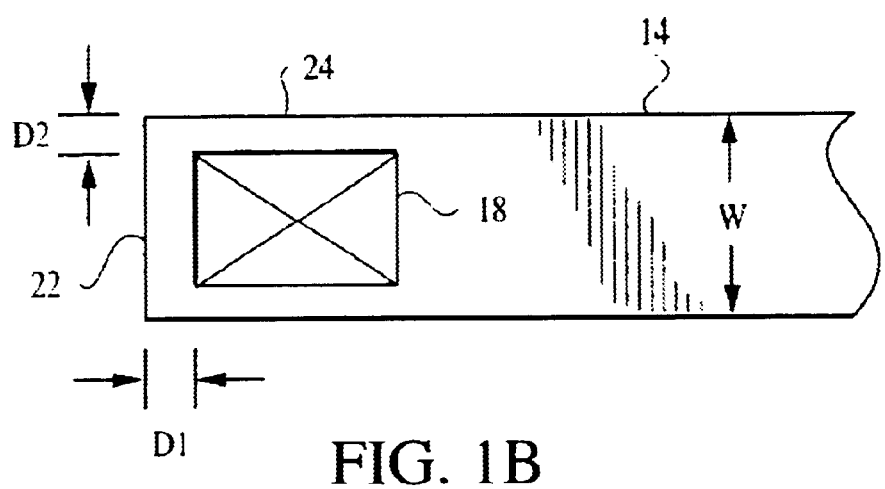
FIG. 1B illustrates a top view of the structure shown in FIG. 1A.
Figure 1C:
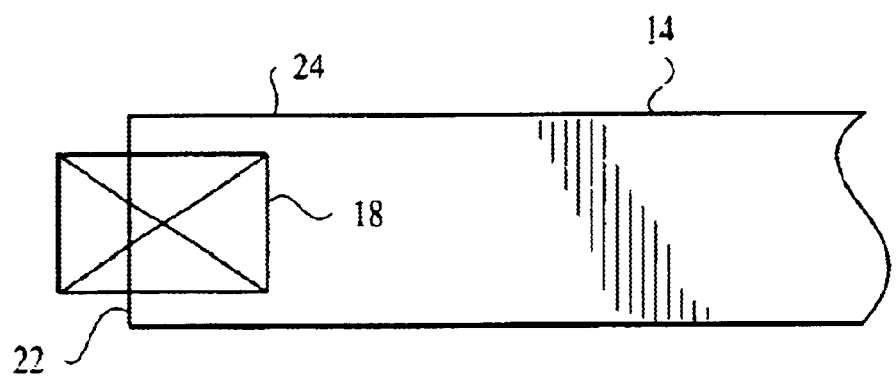
FIG. 1C illustrates a top view of a via opening that is misaligned to an underlying conductor.

It will be appreciated that for simplicity and clarity of illustration, not all of the elements of a semiconductor device are illustrated in the Figures. Additionally, the elements illustrated in the Figures are not necessarily drawn to scale, for example, some elements are exaggerated relative to others. Further, where deemed appropriate, reference numerals have been repeated among the Figures to illustrate corresponding elements.

DETAILED DESCRIPTION

Figure 2:
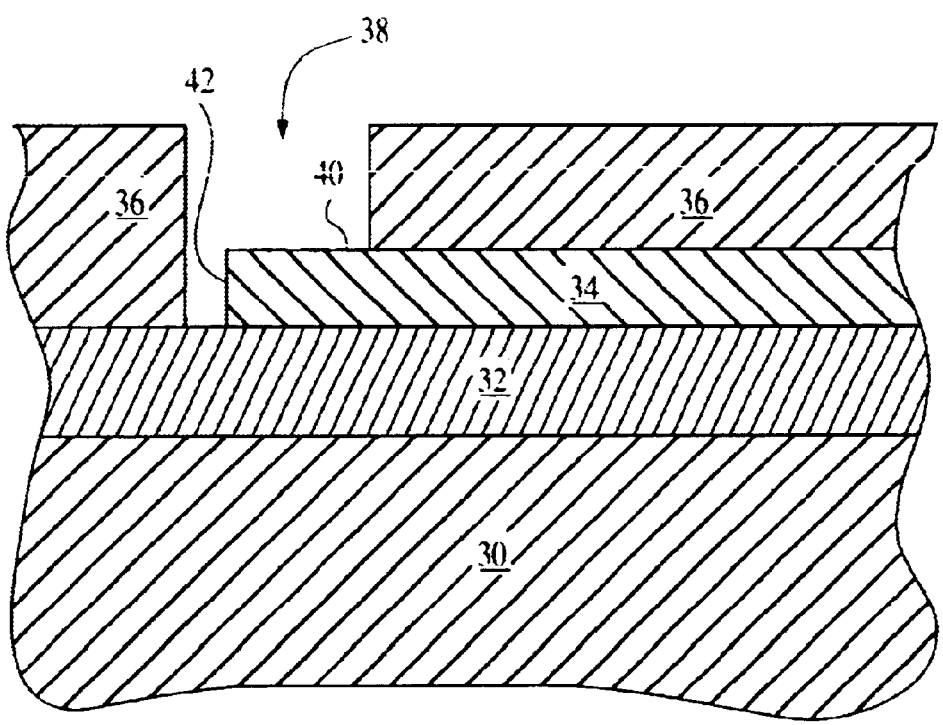
FIGS. 2–4 illustrate, in cross-section, processing steps in accordance with the invention.

FIG. 2, illustrates, in cross-section, a portion of a semiconductor substrate 30 having already undergone several processing steps in accordance with the invention. A device layer 32 overlies semiconductor substrate 30 and is intended to depict a region of a semiconductor device that includes numerous components typically employed in the fabrication of an integrated circuit. Accordingly, device layer 32 can include transistors, resistors, diodes, and the like. Device layer 32 can additionally include device components fabricated within a semiconductor body, such as source and drain regions, channel regions, buried resistors, and the like. Further, semiconductor substrate 30 can be single crystal silicon, epitaxial silicon, silicon-on-insulator (SOI), and the like.

A first conductor 34 overlies a portion of device layer 32. First conductor 34 can be one of a number of different electrically conductive structures typically found in an integrated circuit. For example, first conductor 34 can be a metal lead, a gate electrode, an electrically conductive body that extends from a metal lead or gate electrode, and the like.

An insulating ILD layer 36 overlies semiconductor substrate 30 and includes an opening 38. Opening 38 exposes an upper contact surface 40 of first conductor 34. Opening 38 also exposes an edge surface 42 that depends from upper contact surface 40. In accordance with the invention, ILD layer 36 can be any of a number of insulating materials, such as silicon oxide, silicon dioxide, silicon nitride, and the like. Additionally, ILD layer 36 can be a dielectric material having a particular composition to achieve a specified dielectric constant. Further, first conductor 34 can also include an anti-reflective-coating (ARC) (not shown) overlying the upper surface of first conductive layer 34.

Opening 38 is preferably formed by forming a lithographic pattern (not shown) on ILD layer 36, followed by an etching process to remove insulating material exposed by the lithographic pattern. In a preferred embodiment, a plasma etching process is used to form opening 38. Where ILD layer 36 is silicon dioxide, the plasma etch process employs fluorinated etching chemistry that is reactive with silicon dioxide. The high voltage bias conditions used in the plasma process accelerates activated etching species at the surface of ILD layer 38 and, eventually, at upper contact surface 40. Upon completion of the etching process, upper contact surface 40 is exposed through opening 38.

The structure depicted FIG. 2 illustrates a condition in which a contact or via opening has been misaligned to an underlying conductive layer. In particular, 38 is misaligned to first conductor 34, such that a portion of edge surface 42 is exposed by opening 38. As explained above, the condition depicted in FIG. 2 can lead to excessively high contact resistance ultimately resulting in device failure. In addition to a reduction in contact area, excessively high contact resistance can also result from attack by etching chemicals upon the exposed portions of conductor 34.

During the etching process used to form opening 38, aggressive etching compounds can attack the exposed portions of edge surface 42. The action of etching chemicals upon edge surface 42 can result in roughening of the surface and the formation of pits or gauged areas in the surface. The etching chemicals can be particularly harsh upon ARC layers and will attack edge surface 42 at the interface between an ARC layer and the underlying conductive metal of conductor 34. As described above, in a typical etching process, a plasma etch is used to form opening 38. Where an ARC layer is used, during the ion bombardment occurring during the plasma etching process, polymers can be redeposited into the gauged areas in edge surface 42. The redeposited polymer increases the contact resistance between conductor 34 and interconnect metals that are used in opening 32 to complete fabrication of an interconnect structure.

Figure 3:
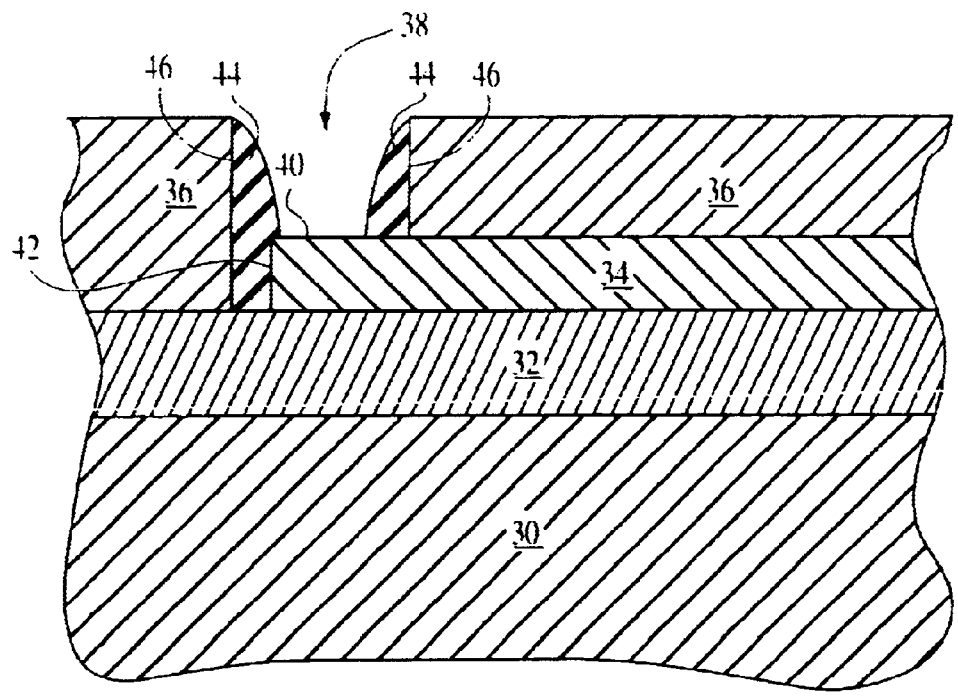

In accordance with the invention and as illustrated in FIG. 3, an insulative liner material 44 is formed in opening 38 to cover portions of edge surface 42 exposed within opening 38. Liner material 44 may also overlie wall surfaces 46 of opening 38 and at least a portion of contact surface 40 of first conductor 34. Preferably, liner material 44 is an insulating material such as silicon dioxide or silicon nitride.

In accordance with a preferred fabrication method, liner material 44 is formed by conformingly depositing a layer of insulating material to overlie insulating layer 36. The insulating material can be deposited by a chemical-vapor-deposition (CVD) process to form a layer of insulating material having a predetermined thickness. The deposited thickness of the insulating material is determined, in part, by the dimensions of opening 38. In a preferred embodiment of the invention, where opening 38 has a characteristic dimension of about 0.15 to about 0.20 microns. the insulating material is deposited to a thickness of about 300 to about 500 angstroms.

Once the insulating material is deposited, it is anisotropically etched to remove the insulating material from horizontal surfaces, while leaving portions of the insulating material that overlie vertical surfaces. As a consequence of the anisotrophic etching process, sidewall spacers are formed on wall surfaces 46 of opening 38. Liner material 44 also covers edge surface 42 of first conductor 34. By covering edge surface 42, any roughening or gauging of edge surface 42 that occurred during the etching process to form opening 38 is covered by insulating material. Accordingly, excessively high contact resistance resulting from damage to first conductor 34 is advantageously avoided. Those skilled in the art will appreciate that the preferred anisotrophic etching process requires that liner material 44 have a composition that is differentially etchable with respect to the composition of insulating layer 36. Accordingly, in a preferred embodiment of the invention, liner material 44 is composed of a CVD oxide or a plasma nitride material and ILD layer 36 is composed of fluorinated silicate glass (FSG).

In accordance with the invention, opening 38 is filled with an electrically conductive material to form a metallized plug 48. Preferably, metallized plug 48 is formed by depositing a refractory metal material into opening 38. Metallized plug 48 forms a low-resistance contact to upper contact surface 40 of first conductor 34. Those skilled in the art will appreciate that numerous conductive materials can be utilized to form metallized plug 48. For example, refractory metals, refractory metal alloys, and the like can be used.

Figure 4:
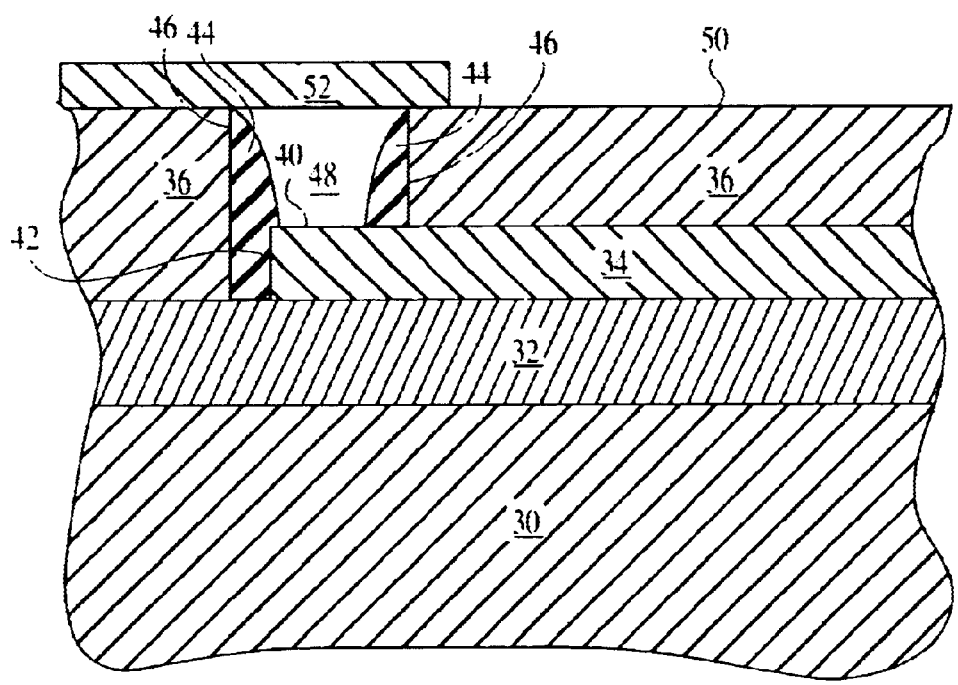

As illustrated in FIG. 4, once opening 38 is filled with an electrically conductive material, a planarization process is carried out to form a planar surface 50 across semiconductor substrate 30. Preferably, a chemical-mechanical-polishing (CMP) process is performed to planarize the upper surface of ILD layer 36 and metallized plug 48. Then, a second conductive layer 52 is formed to overlie planar surface 50. Second conductive layer 52 forms a low-resistance contact with metallized plug 48.

Where liner material 44 is formed as a sidewall spacer, the lateral dimension of opening 38 is gradually reduced in a direction from second conductive layer 52 toward contact surface 40 of first conductor 34. The gradual reduction in the lateral dimension of opening 38 improves the step coverage of the process used to form metallized plug 48. In one embodiment, metallized plug 48 is formed by a CVD process in which a layer of conductive material is deposited over the surface of ILD layer 36 and into opening 38. Those skilled in the art will appreciate that, where the lateral dimension of opening 38 is very small in comparison to the thickness of ILD layer 36 (a high aspect ratio condition), the deposition of conductive material within opening 38 can be non-uniform. By slightly tapering the sidewalls of opening 48, the step coverage during the deposition process is improved.

Those skilled in the art will recognize that the structure illustrated in FIG. 4 as a metallized interconnect structure is useful for electrically connecting metal interconnect layers in a semiconductor device. Although only one interconnect structure is illustrated in FIG. 4, those skilled in the art will appreciate that in a typical integrated circuit, many such interconnect structures are formed. Further, although only two conductor layers are illustrated in FIG. 4, in a typical integrated circuit there can be numerous overlying metal conductor layers. Further, the metallized interconnect structure illustrated in FIG. 4 can be used to electrically connect the numerous overlying metal conductor layers. Although the metallized interconnect structure illustrated in FIG. 4 is generally representative of a via interconnect, those skilled in the art will appreciate that the metallized interconnect structure and fabrication method of the invention can be equally advantageously employed for the fabrication of contact structures in an integrated circuit device.

Thus it is apparent that there has been described, in accordance with the invention, a semiconductor device having a metallized interconnect structure and method of fabrication that fully provides the advantages set forth above. Those skilled in the art will recognize that numerous modifications and variations can be made without departing from the spirit and scope of the invention. For example, various etching processes, such as electron-cyclotron-resonance (ECR) etching can be used. Accordingly, all such variations and modifications are intended to be included within the scope of the appended claims and equivalents thereof.

What is claimed is:

1. A process for fabricating a semiconductor device comprising:

providing an electrical conductor and an overlying electrical insulator, wherein the electrical insulator has an opening therein exposing a contact portion and an edge portion of the conductor, and wherein the opening has a sidewall extending from the contact portion to an upper surface of the electrical insulator;

forming a sidewall spacer to overlie the sidewall of the opening and the edge portion of the conductor; and filling the opening of the electrical insulator with an electrically conductive material to form an electrical contact exclusively to the contact portion of the conductor.

2. The process of claim 1, wherein providing an overlying electrical insulator comprises forming an insulating layer overlying the electrical conductor and aligning the opening to the electrical conductor, such that at least a portion of the sidewall substantially coincides with the edge portion of the electrical conductor.

3. The process of claim 1, wherein filling the opening comprises forming the electrically conductive material in the opening, such that the sidewall spacer prevents the electrically conductive material from directly contacting the edge portion of the electrical conductor.

4. The process of claim 1, wherein forming a sidewall spacer comprises depositing a dielectric material.

5. The process of claim 1, wherein filling the opening comprises depositing a refractory metal.

6. The process of claim 1, wherein providing an electrical conductor comprises forming an electrical conductor characterized by a line width, and wherein providing an overlying electrical insulator comprises forming an electrical insulator layer overlying the electrical conductor and forming the opening to have a diameter substantially the same as the line width.

7. The process of claim 1, wherein providing an overlying electrical insulator and forming a sidewall spacer comprise depositing substantially the same dielectric material.

8. A process for fabricating a metallized interconnect structure:

providing a first conductor and an insulating layer overlying the first conductor, wherein the first conductor has a contact surface and an edge surface depending from the contact surface;

forming an opening in the insulating layer that exposes at least a portion of the contact surface and at least a portion of the edge surface;

forming an insulative liner material overlying at least the portion of the edge surface exposed by the opening; and filling the opening with an electrically conductive material to form an electrical contact exclusively to the contact surface of the first conductor.

9. The process of claim 8, wherein forming an insulative liner material comprises forming an insulative liner material that is differentially etchable with respect to the insulating layer.

10. The process of claim 9, wherein forming an insulative liner material further comprises anisotropically etching the insulative liner material.

11. The process of claim 8, wherein providing a first conductor comprises providing a conductor having an anti-reflective coating overlying the conductor.

* * * * *